(12) United States Patent
Shafer et al.

(10) Patent No.: US 6,794,957 B2
(45) Date of Patent: Sep. 21, 2004

(54) CATV FILTER ASSEMBLY WITH IMPROVED ELECTRICAL GROUNDING

(75) Inventors: Steven Shafer, Chittenango, NY (US); Eric J. Purdy, Constantia, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 0 days.

(21) Appl. No.: 10/309,375

(22) Filed: Dec. 3, 2002

(65) Prior Publication Data

US 2004/0104787 A1 Jun. 3, 2004

(51) Int. Cl.$^7$ ................................................ H03H 7/01
(52) U.S. Cl. ...................................... 333/185; 333/176
(58) Field of Search ................................ 333/172, 174, 333/175, 176, 185

(56) References Cited

U.S. PATENT DOCUMENTS

| | | | |
|---|---|---|---|
| 4,296,390 A | 10/1981 | Vanderheyden et al. | 333/182 |
| 4,610,032 A | 9/1986 | Miller et al. | 455/325 |
| 4,772,221 A | 9/1988 | Kozlof | 439/544 |
| 4,797,120 A | 1/1989 | Ulery | 439/578 |
| 5,032,091 A | 7/1991 | Itzkoff | 439/620 |
| 5,081,434 A | 1/1992 | Sakamoto et al. | 333/182 |
| 5,249,984 A | 10/1993 | Antonini et al. | 439/620 |
| 5,475,347 A | 12/1995 | Kwak | 333/185 |
| 5,630,734 A | 5/1997 | Phillips, Jr. | 439/620 |
| 5,670,744 A | 9/1997 | Ritchey | 174/51 |
| 5,893,766 A | 4/1999 | Bellas et al. | 439/95 |
| 6,165,019 A | 12/2000 | Kha et al. | 439/620 |
| 6,323,743 B1 | 11/2001 | Zelenz et al. | 333/185 |
| 6,636,129 B2 * | 10/2003 | Zennamo et al. | 333/176 |

* cited by examiner

*Primary Examiner*—Robert Pascal
*Assistant Examiner*—Dean Takaoka
(74) *Attorney, Agent, or Firm*—Wall Marjama & Bilinski; James R. Muldoon (57) ABSTRACT

A filter assembly for use in the CATV industry includes a circuit formed by components mounted upon at least one circuit board with a plurality of paths or traces on the board connecting each section of the circuit to a member at ground potential. The grounding member may be a grounding bus on the circuit board which is in contact with a housing wherein the circuit board is mounted, or the paths may extend from a circuit component to contact the housing directly. The paths are kept to a very short length, preferably not more than 2.5 millimeters and in no case longer than 5 millimeters. This avoids the presence of inductive and/or resistive parasitics in the paths, thereby avoiding the degradation of performance typical in comparable prior art filter circuits, particularly at higher frequencies, e.g., above about 300 MHz. In the preferred embodiment grounding buses in the form of elongated strips extend along opposite edge portions of the board. The housing is in two, cylindrical, telescopingly engaged portions. A pair of open slots extend from one end of the inner portion on opposite sides thereof for a portion of its length and edge portions of the circuit board which include the grounding buses are positioned in these slots. The thickness of the board is less than the initial width of the slots, but the outer housing portion has a smaller inside diameter than the outside diameter of the inner portion, whereby the two are assembled with a force fit which radially compresses the inner portion by narrowing the slot widths and urging the slot edges into tight contact with the grounding buses. One or more "bumps" of conducting material are preferably placed on each grounding bus near the closed ends of the slots to ensure grounding contact.

45 Claims, 11 Drawing Sheets

CATV FILTER ASSEMBLY WITH IMPROVED ELECTRICAL GROUNDING

BACKGROUND OF THE INVENTION

The present invention relates to electronic filter assemblies used in the cable television (CATV) industry, and more specifically to structural features of such filter assemblies directed to providing improved electrical grounding of a filter circuit carried on a printed circuit board.

In typical CATV applications a filter circuit or network is provided to pass signals having frequencies within one or more specified band widths, sometimes with a desired amount of signal attenuation, while blocking signals of other frequencies. It has been found convenient to mount the electrical components, e.g., capacitors, inductors and resistors, on one or more printed circuit boards in essentially conventional fashion. That is, for such CATV filters as highpass and lowpass filters, diplex filters, windowed highpass filters, and step attenuator (or return path) filters, tunable filter circuits and shielding between filter components and circuits are not normally required. The circuit board(s) carrying the filter circuit components is/are mounted within a suitable, protective housing. Prime requirements for the circuitry and housing means are preventing ingress of moisture and foreign matter through the filter connectors (such as shown in U.S. Pat. No. 5,278,525 to Palinkas) and the provision of a solid and reliable electrical ground between the filter circuit(s) and the housing (such as disclosed in U.S. Pat. No. 6,323,743 to Zelenz et al). The latter requirement is particularly critical when the filter is intended to handle signals of high frequency. In fact, the grounding arrangements of the prior art, including that of the Zelenz et al patent, are not fully reliable for frequencies above about 300 Mhz.

Filter circuits of this type are typically designed with a plurality of interconnected "sections," sometimes referred to as "poles," "stages," or by other terms. As generally understood in the art, and as used herein, the term "section," as applied to filter circuits, denotes a discrete portion of the circuit including a group of two or more components which establish a resonance (e.g., a capacitor and an inductor). In general, the performance of highpass, lowpass, and other types of CATV filters is enhanced by increasing the number of sections. That is, other factors being equal, a circuit having four sections is superior to a circuit having two sections.

Oftentimes, the greatest obstacle to achieving optimum circuit performance is proper grounding. Each section of the circuit requires a connection to ground. Traditionally, filter circuits carried in housings less than 2.1 cm in diameter make the ground contact between the housing and circuit sections at the male connector side of the housing. This is the case, for example, in the previously referenced Zelenz, et al patent where grounding pads are provided at each of the two corners of the board at the male connector end and on both surfaces of the circuit board. When the ground contact is placed at one end of the board, the electrical path from the circuit sections to the ground contact lengthens as the section components are placed farther away from the housing ground contact. Inductance and resistance parasitics are introduced into the electrical path in proportion to its length, i.e., the longer the path between the circuit section and the ground contact, the greater the level of undesirable inductance and resistance which are introduced. The additional inductance limits the circuit operating frequency range and the resistance severely degrades the "Q" (quality factor) of the circuit. The present invention is based upon recognition of these effects and minimizing their impact on circuit performance.

The principal object of the present invention is to provide a filter assembly for CATV applications with improved electrical grounding of the filter circuit.

A further object is to provide a CATV filter assembly having a filter circuit with a plurality of sections each of which is connected to ground potential through an electrical path of minimal length.

Another object is to provide a CATV filter assembly including a circuit board carrying a filter circuit and mounted in a housing at ground potential wherein the board is mechanically connected and the circuit is electrically connected to the housing without a soldering operation.

A still further object is to provide a CATV filter assembly including a filter circuit carried on a printed circuit board mounted within a housing having two mating portions wherein the filter circuit is placed in electrical (grounding) communication with the housing by mutual assembly of the two portions.

Other objects will in part be obvious and will in part appear hereinafter.

SUMMARY OF THE INVENTION

The invention will be shown and described in three physical embodiments, although it will be understood that the electrical and structural components and their arrangement are subject to many modifications within the scope and spirit of the invention. In each disclosed embodiment the circuit components are mounted upon a single circuit board using surface mount components, although the invention may be implemented with filter circuits utilizing through-hole components, or a plurality of circuit boards. Likewise, the invention may be practiced with a wide variety of filter circuit designs although it is directed to use with circuits having a plurality of sections, each of which has a direct path to ground. That is, at least one component of each section of the circuit is connected by a path on the circuit board to a member which is at ground potential. The components are connected to one another and to the grounding member by electrically conducting paths on the board which are sometimes referred to as traces or runs, but in the present description and claims are uniformly called "paths."

The housing or casing wherein the circuit board is mounted is of electrically conducting material at ground potential, as in many conventional filter assemblies of this type, and provides the ultimate ground for the circuit. The paths from the respective sections may contact portions of the housing directly, or (as in the preferred embodiment) may extend from each section to a grounding bus on one or both surfaces of the board. The grounding bus is in direct electrical communication with the housing and thus provides a connection to ground for each section of the circuit components. The grounding bus may be (again, as in the preferred embodiment) in the form of an elongated strip, in which case it is important the strip be in direct contact with the housing over substantially all of its length so that an ungrounded portion of appreciable length will not act as a lengthy electrical path between the ground connection and one or more circuit sections, thereby contributing to the problem of inductance and resistance parasitics. In any case, the length of the electrical path from each section of the circuit to a member at ground potential, i.e., not simply to the grounding bus but to a point on the grounding bus which is in direct, grounding contact with the housing, is kept to a minimum which may be as small as one millimeter or less, but in no event is more than 5 millimeters.

In the first disclosed and preferred embodiment, the housing includes inner and outer, hollow, cylindrical portions. The inner portion includes a pair of open slots on opposite sides of the cylinder extending from one end for part of the axial length thereof. The printed circuit board carrying the filter circuit components and connecting paths has parallel, linear side edges with strips of conducting metal extending along marginal portions of the board adjacent each side edge on both the top and bottom surfaces of the board. The widths of the slots in the inner housing portion are greater than the thicknesses of the respective edge portions of the circuit board, and the outside diameter of the inner housing portion is slightly greater than the distance between the outer edges of the board.

In addition to the circuit board and components mounted thereon, and the two housing portions, the assembly includes male and female connector assemblies, each extending linearly between a first end, which is electrically and mechanically attached to the circuit board, and a terminal end. The assembly further includes an insulator and seal through which the female pin extends, an insulator through which the male connector extends and an O-ring forming a seal between the inner and outer housing portions. In assembly, the circuit board, with male and female connectors attached, is mounted to the inner portion by relative axial movement of the two parts with the edge portions of the board positioned between opposing edges of the slots on each side of the housing inner portion.

As previously indicated, the outer edges on each side of the board are positioned inwardly a small distance from the outer surface of the inner housing portion. The outer diameter of the inner portion is slightly greater than the inner diameter of the outer portion, at least over the parts of the two portions which are in mutually engaged relation in the fully assembled condition of the housing. Thus, as the inner and outer sections are moved axially into mating relation, there will be a tight, interference fit of the outer portion over the inner portion; in fact, it is preferred that the portions be assembled with the aid of an arbor press, or the like. The female and male connectors pass though openings in the insulators and seal with force fits. The O-ring is received in a groove in the inner portion for deformable engagement between the inner and outer housing portions.

As the outer portion is forced over the inner portion, the opposing edges of the slots on each side of the inner portion are moved toward one another, more markedly at the open ends of the slots. This urges the inner housing portion, at least in the region of the open ends of the slots, into tight contact with the grounding buses (strips) adjacent the lateral edges of the circuit board. As a further feature, one or more raised portions or "bumps" of conductive material, e.g., soft solder, are provided on the surfaces of the grounding buses, at least in the regions thereof which are positioned near the closed ends of the slots. The edges of the slots are not narrowed as much near the closed ends as near the open ends by forced insertion of the outer over the inner portion. The bumps, in effect, increase the thickness of the circuit board in these regions, thereby ensuring a tight connection of the housing and grounding buses. An excellent electrical ground connection between each of the circuit sections and housing is provided by the force fit contact of the grounding buses of the circuit board with the inner housing portion over substantially all of the buses' length while maintaining the minimal length of the electrical paths from the circuit sections to the buses. Likewise, excellent protection against penetration of moisture or foreign matter into the interior of the assembled housing is provided by the interference fit of the inner and outer housing sections, as well as the deformable seals and O-ring. Thus, in the preferred embodiment, the force fit of the housing portions and mechanical engagement of the board edges between opposing edges of the slots permits fully grounded assembly without the usual soldered connections.

In the second embodiment, the grounding buses along the side edges of the board are connected to the housing along their full length by soldering, while maintaining the minimal length of the electrical paths between all circuit sections and the grounding point. In a third embodiment, the location of the grounding bus(es) is/are at a position other than along marginal side edges of the board, while retaining the minimal path lengths and without the necessity of soldered connections. A version of the circuit board layout is disclosed wherein the paths from each section directly contact the housing rather than a grounding bus on the board.

The foregoing and other features of construction and operation of the filter assembly of the invention will be more readily understood and fully appreciated from the following detailed description, taken in conjunction with the accompanying drawings.

BRIEF DESCRIPTION OF THE DRAWINGS

FIG. 7b is an end elevational view, in section, on the line 7b—7b of FIG. 7a;

DETAILED DESCRIPTION

Figure 1:
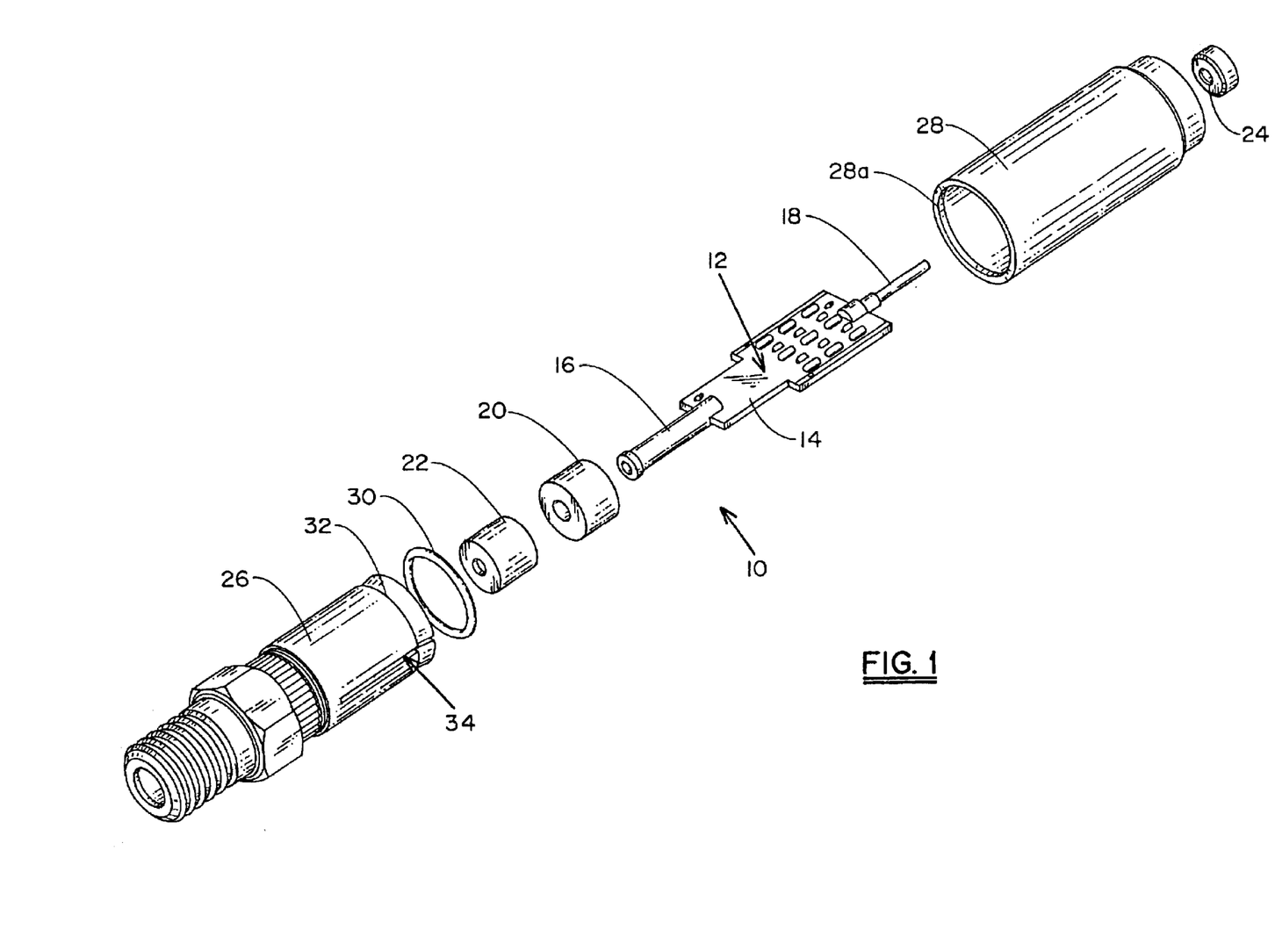
FIG. 1 is an exploded perspective view of the preferred embodiment of the filter assembly.

Referring now to the drawings, in FIG. 1 is shown the currently preferred embodiment of the filter assembly, denoted generally by reference numeral 10. Assembly 10 includes a filter circuit having a plurality of components (inductors, capacitors, etc.), collectively indicated by numeral 12. Although the circuit may be of any design suitable for the intended application of the filter assembly in the CATV industry, an example of an actual circuit is provided later herein. Circuit components 12 are mounted by conventional surface mount techniques upon the usual dielectric substrate or board 14. Female connector assembly 16 and male connector 18 are each attached at one end to board 14 in electrical communication with the circuit formed by components 12. Both the structure and manner of connection of the male and female connectors to the circuit board are entirely conventional. Female connector assembly 16 extends, with force fit, through openings in deformable rubber seal 20 and insulator 22. Male connector 18 extends, with force fit, through an opening in insulator 24.

Figure 2:
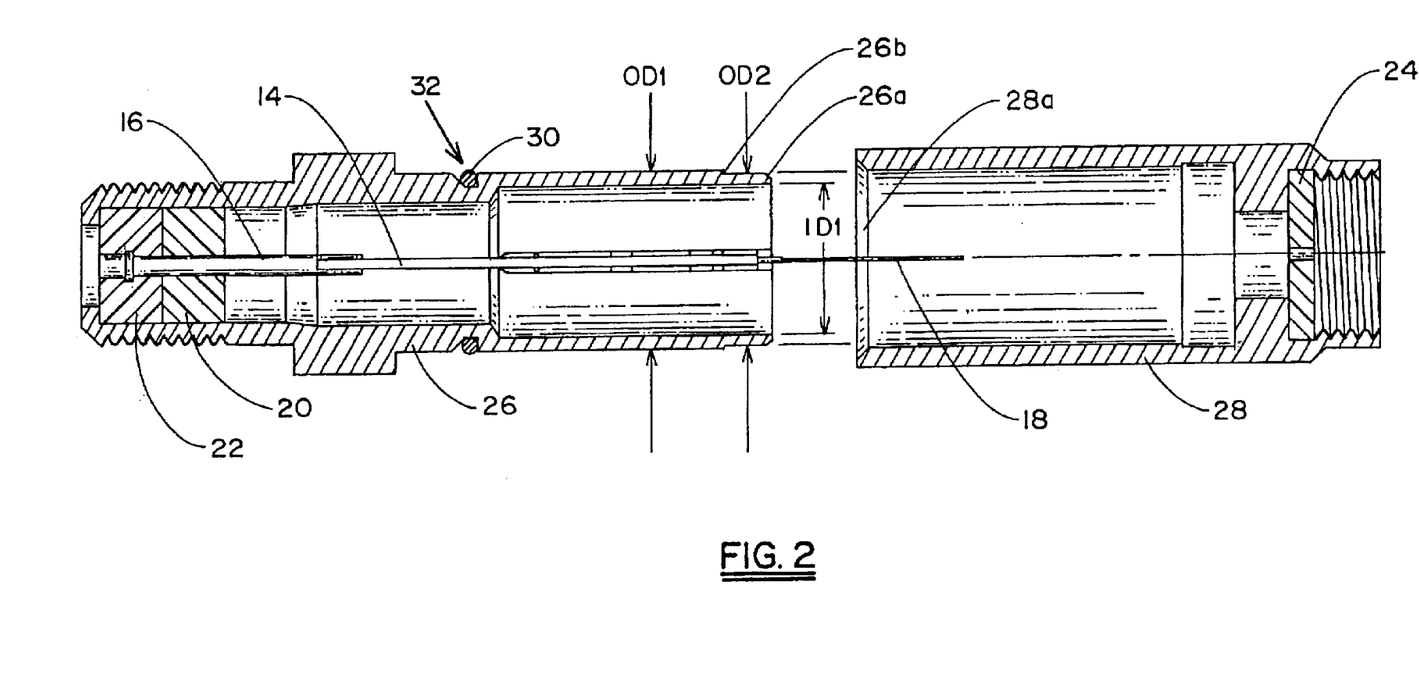
FIG. 2 is a side elevational view of the filter assembly of FIG. 1 in axial cross section in an intermediate stage of assembly.
Figure 3:
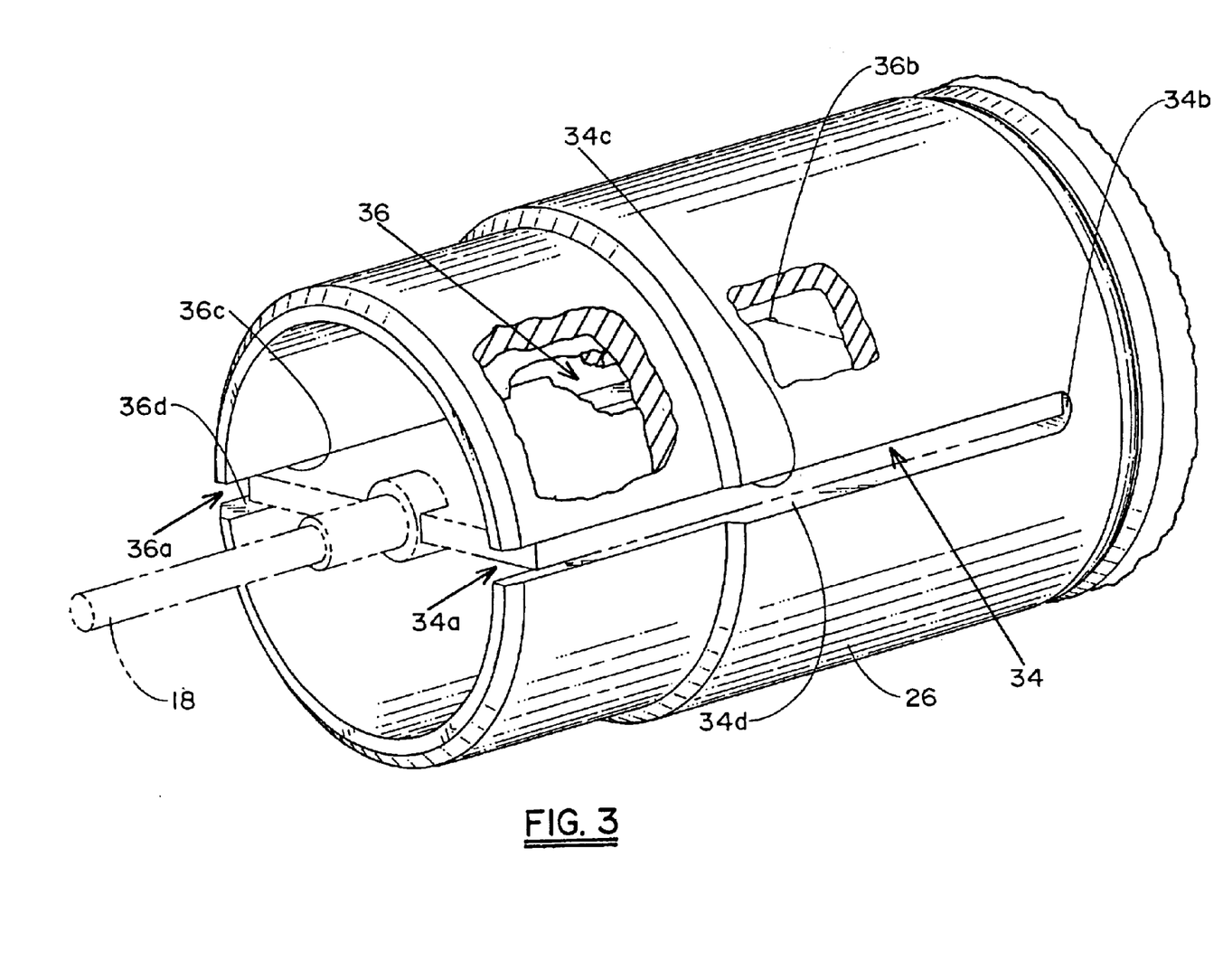
FIG. 3 is an enlarged, fragmentary, perspective view of the inner housing section of the assembly, with the circuit board and male connector shown in phantom lines.

The circuit board with attached connectors, together with the insulators and seal are mounted within a housing formed by inner and outer portions 26 and 28, respectively, each being in the form of a hollow cylinder. O-ring 30 is received in groove 32 in inner portion 26 and serves as a moisture resistant seal between portions 26 and 28 in their assembled condition. The elements are shown in FIG. 2 prior to the final assembly operation. In the preliminary operations, seal 20 and insulator 22 have been inserted into inner portion 26 and insulator 24 has been inserted within outer section 28 in the positions indicated. Also, circuit board 14 has been inserted into inner portion 26 with female connector assembly 16 extending through the opening in seal 20 and into the opening in insulator 22. As best seen in FIG. 3, inner portion 26 includes a pair of open slots 34 and 36 extending from open ends 34a and 36a, respectively, at one end of inner portion 26 to closed ends 34b and 36b, respectively. Slot 34 has opposing, spaced edges 34c and 34d, and slot 36 has opposing, spaced edges 36c and 36d.

Figures 4A, 4B, 4C:
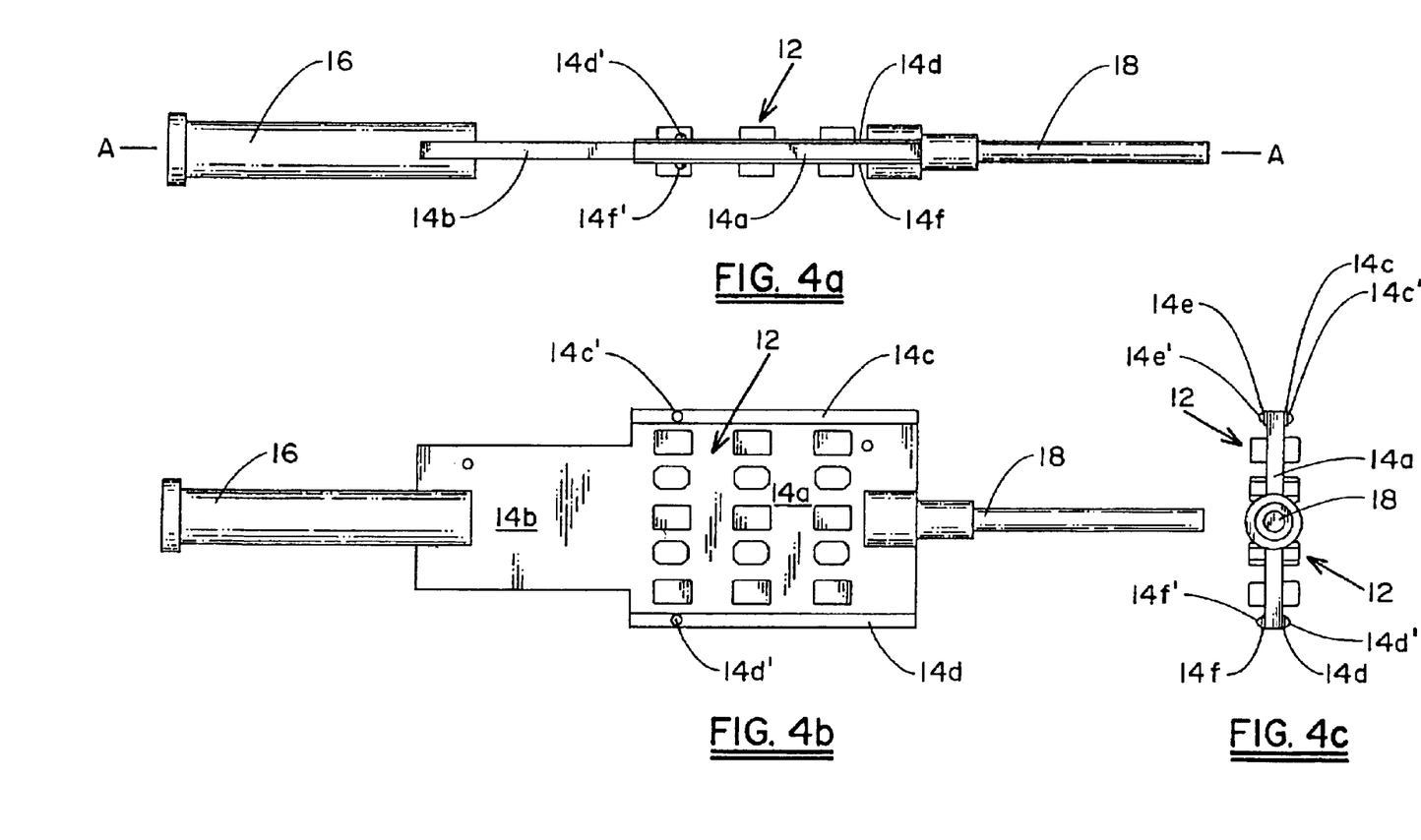
FIGS. 4a, 4b and 4c are side elevational, top plan, and end elevational views, respectively, providing an orthogonal projection of the circuit board and connectors.

Circuit board 14 is shown in greater detail in the orthographic projection of FIGS. 4a–4c. In the illustrated embodiment, board 14 includes relatively wide and narrow, integral portions 14a and 14b, respectively, each having substantially parallel side edges spaced equally from central axis A—A. Strips of thin, copper foil 14c and 14d are securely adhered to what is termed the top surface (FIG. 4b) of board 14 in lateral edge portions bordering the side edges of portion 14a, and like strips 14e and 14f are secured to lateral edge portions of the bottom surface. As explained later in more detail, these strips are in electrical communication with the circuit formed by components 12 and serve as grounding buses for the circuit. Small raised portions, or "bumps" are provided on each of strips 14c, 14d, 14e and 14f. In the illustrated embodiment, one bump is provided on each of the strips, reference numerals 14c', 14d', 14e' and 14f' denoting the bumps on strips 14c, 14d, 14e and 14f, respectively. More than one bump may be provided on any or all strips, if desired, but it is preferred that at least one bump be provided on each strip near the end thereof at the juncture between portions 14a and 14b. The bumps are of conductive material, and may conveniently be deposited as small drops of solder.

When board 14 has been inserted into inner section 26 the lateral edge portions of wider portion 14a are positioned in slots 34 and 36, and extend substantially the full length of the slots. As shown in FIG. 2, inner portion 26 has an outside diameter OD1 over the major portion of its length and a somewhat smaller diameter OD2 over a portion of the end at which the open ends of slots 34 and 36 are formed. The width of board portion 14a is slightly less than diameter OD2 but larger than the inside diameter ID1 of the part of portion 26 which includes slots 34 and 36. Bevel 26a is formed about the periphery of the end of portion 26 bordering OD2, and bevel 26b is formed about the periphery of the shoulder at the junction of the two outside diameters.

Figure 5A:
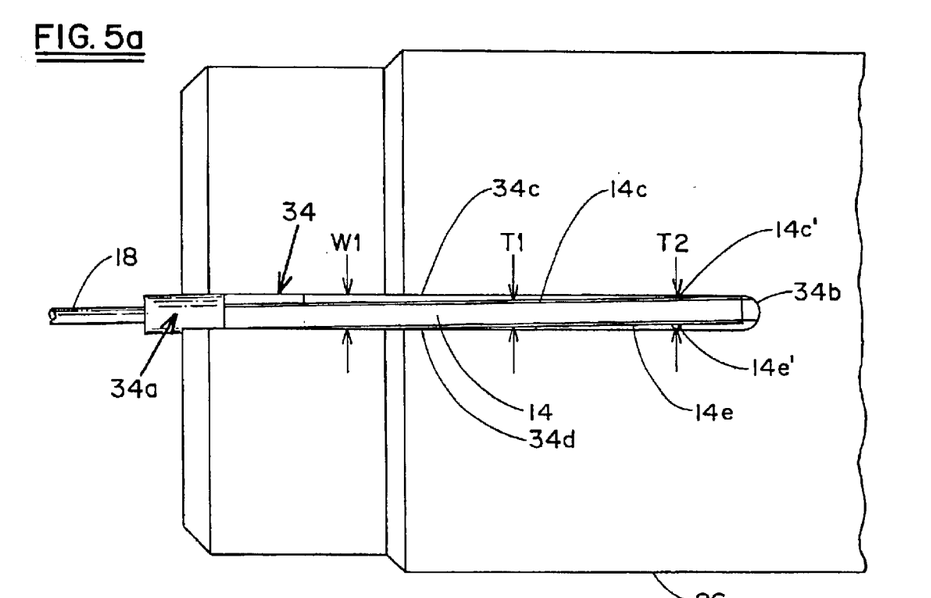
FIGS. 5a and 5b are fragmentary, elevational views, partly in section, of portions of the assembly in successive stages of assembly.
Figure 5B:
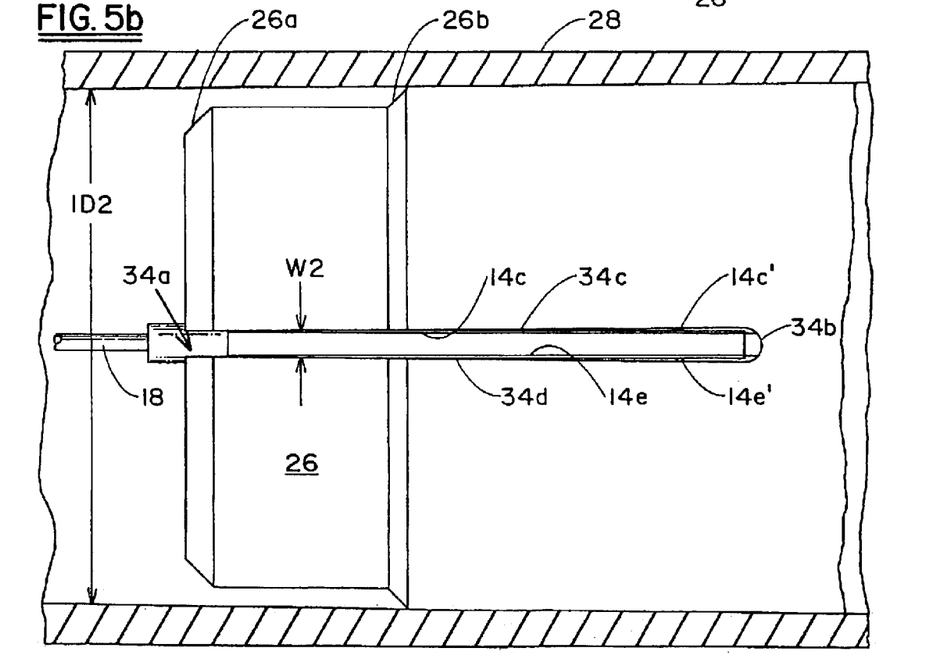

Referring now to FIGS. 5a and 5b, inner and outer portions 26 and 28, respectively, are shown in axially aligned relation, before and after the final assembly step of forcing the outer over the inner portion. The inside diameter ID2 of portion 28 is larger than OD2 but smaller than OD1 of portion 26. Bevel 28a (FIGS. 1 and 2) is formed about the periphery of the end of outer section 28 bordering ID2. Bevels 26a and 28a, together with the fact that OD2 is less than ID2 (by a few thousands of an inch) facilitate mating engagement of section 26 and 28 over the axial length of the part of inner portion 26 of diameter OD2. Bevels 26b and 28a facilitate axial alignment of portions 26 and 28 as they are forced into telescopically engaged relation. The difference in diameters OD1 and ID2 is preferably great enough to require the use of an arbor press, or other appropriate tool, to effect relative axial movement of the two sections into full engagement, as seen in FIG. 5b. This interference fit results in some degree of radially inward deformation of the slotted part of inner portion 26 in the fully assembled condition. Prior to assembly of the two portions, as shown in FIG. 5a, the spacing of opposing edges 34c and 34d, i.e., the width of slot 34, denoted by dimension W1 is greater than the thickness T1 of the portion of board 14 which is positioned between the slot edges, and is about the same as thickness T2 in the area of bumps 14d' and 14f'. The same is true, of course, with respect to slot 36.

After assembly, as seen in FIG. 5b, the interference fit with outer portion 28 has caused slot 34 to narrow, i.e., opposing edges 34c and 34d are closer together and engage the surfaces of strips 14c and 14e. The amount of inward movement of the slot edges is greatest, of course, at the open end of the slot. The width near the open ends of the slots is indicated in FIG. 5b by dimension W2 (<W1). Although the amount of inward movement of slot edges 34c and 34d is less as slot 34 approaches closed end 34b, it is nevertheless sufficient to cause the slot edges to engage bumps 14c' and 14e'. Thus, a very solid and reliable ground path along substantially the entire length of grounding buses 14c, 14d, 14e and 14f is provided by the assembly of FIGS. 1–5b. It will be noted that the electrical communication between the grounding buses and housing is established and maintained without any soldering operations during or after assembly of the parts. Circuit board 14 is narrower than the outside diameter of the inner portion to avoid possibly damaging compression by interference fit of the board with the inside diameter of the outer portion. The circuit board is captured with a high pressure contact from the copper ground bus to the inner housing portion along a sufficient length on each side of the circuit components to ensure adequate isolation from inductance and resistance parasitics for proper circuit operation, particularly at frequencies above about 300 Mhz. The compressive engagement of O-ring 30 between portions 26 and 28 effectively prevents ingress of moisture or foreign matter in the housing.

Figure 6A:
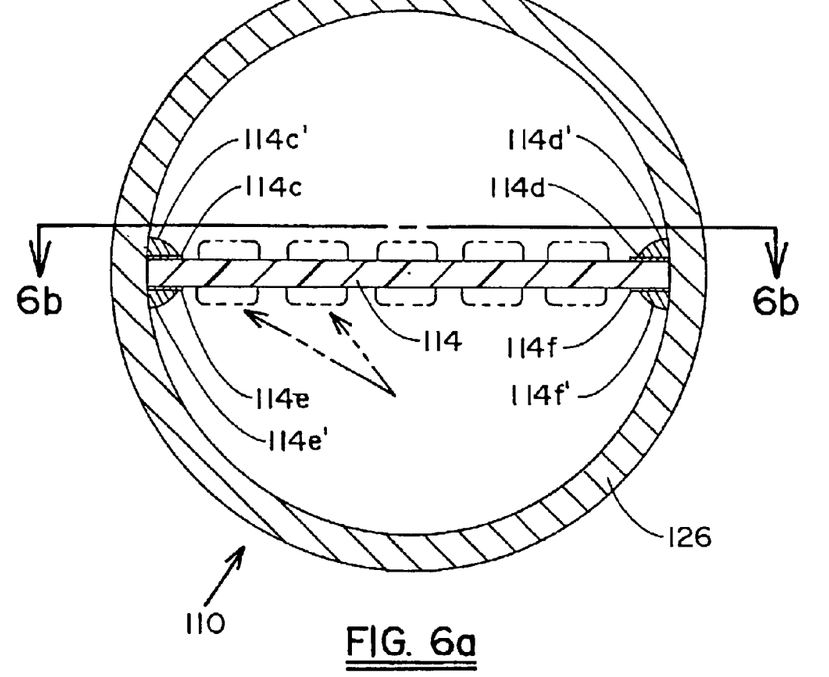
FIG. 6a is an end elevational view, in section, of a second embodiment of the assembly.
Figure 6B:
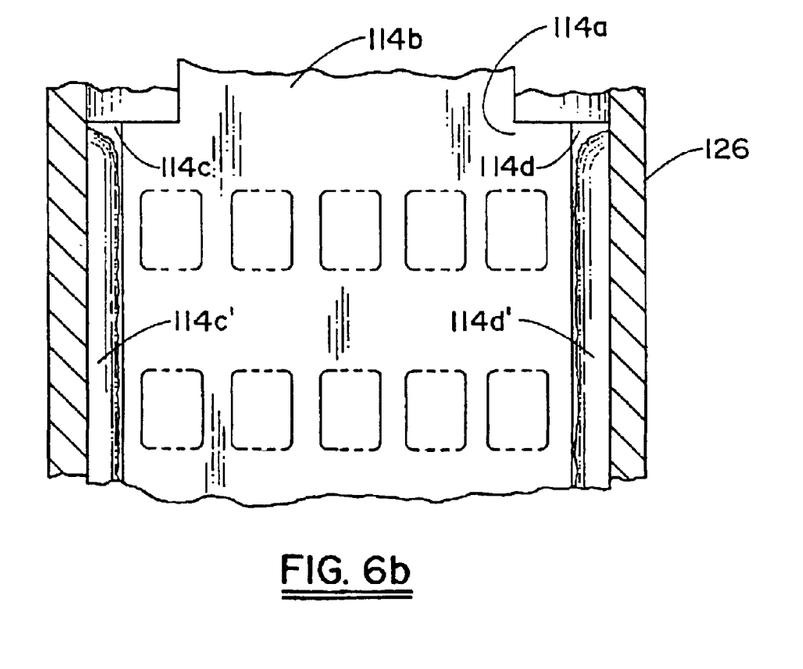
FIG. 6b is a fragmentary, top plan view in section on the line 6b—6b of FIG. 6.

Turning now to FIGS. 6a and 6b, the filter assembly is shown in a second embodiment 110 wherein circuit board 114, carrying circuit 112 is mounted within housing 126. Grounding buses 114c and 114d are provided on the top surface, and buses 114e and 114f on the bottom surface of board 114. The width of board 114 is approximately the same as the inside diameter of housing 126 and each of the ground buses is placed in electrical contact with housing 126 by solder beads 114c', 114d', 114e' and 114f' along substantially the full length of each bus. Again, this provides a firm, reliable ground to which each section of the filter circuit may be connected with short electrical paths between the sections and the grounding buses, all portions of which are in direct electrical communication with the housing. Although soldering operations are necessary in this embodiment, the cost thereof is at least somewhat offset by elimination of the slots in the housing, the bumps on the grounding buses and the force fit assembly of inner and outer housing portions. One end of housing 126 may be closed (with provision for passage of the male or female connector) and a suitable cap placed in sealed engagement with the other end after mounting the circuit board therein. Many options for configuring and sealing the housing are available in this embodiment.

Figure 7A:
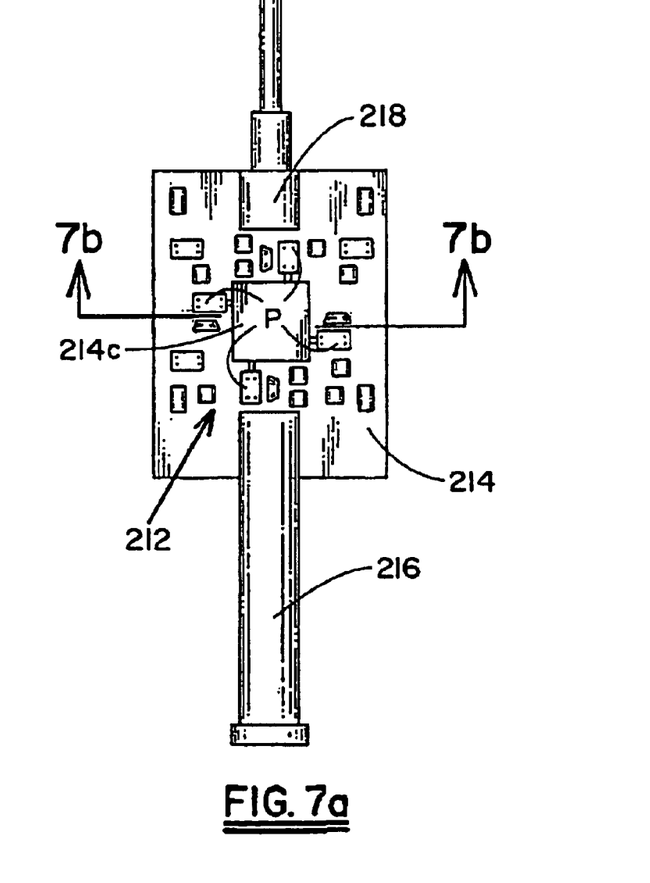
FIG. 7a is a top plan view of a circuit board and connectors forming part of a third embodiment of the invention.
Figure 7B:
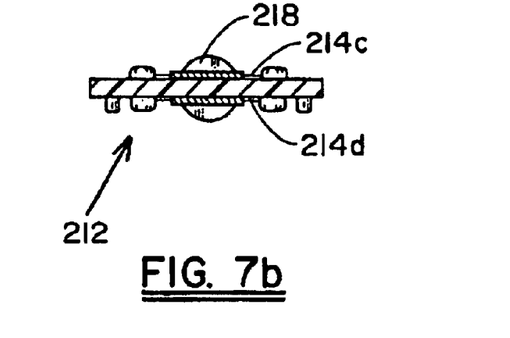
Figure 7C:
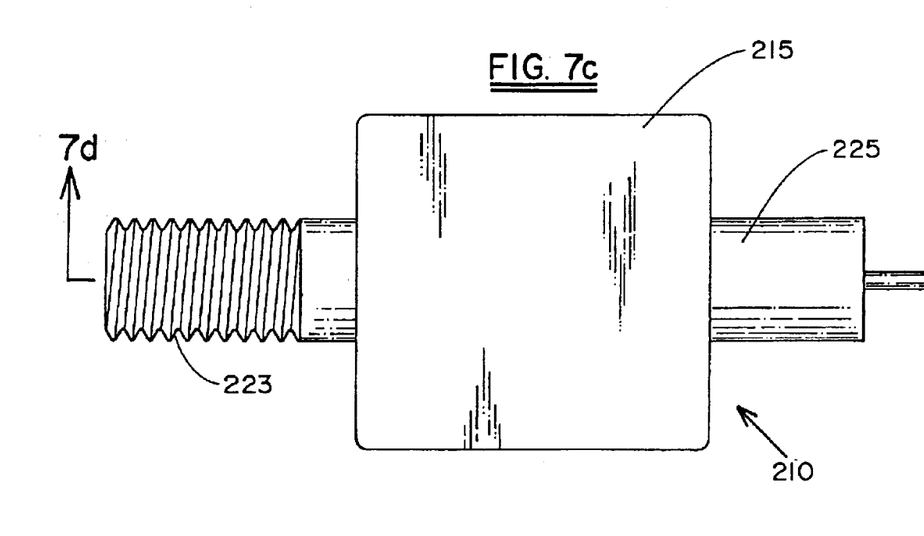
FIGS. 7c, 7d, and 7e are top plan, side elevational (in section on the line 7d—7d of FIG. 7c) and end elevational views, respectively, providing an isometric projection of the complete filter assembly of the third embodiment.
Figure 7D:
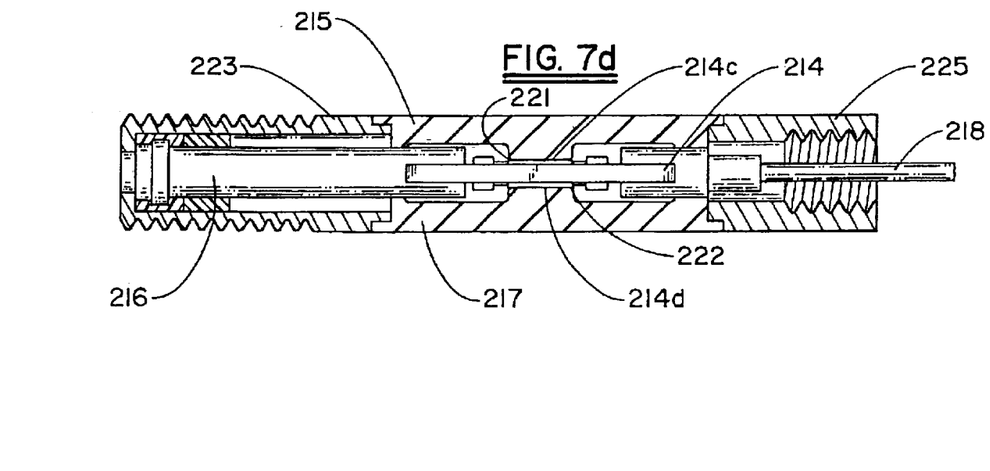
Figure 7E:
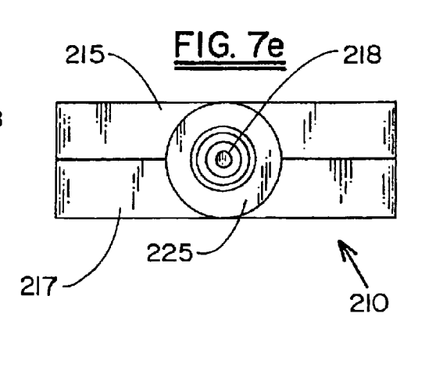

A third structural embodiment of the assembly, denoted generally by reference numeral 210, is shown in FIGS. 7a–7e. Circuit board 214 carries on both top and bottom surfaces circuit components 212 connected by electrical paths on the board to one another and to grounding buses 214c and 214d which are located in positions other than along the side edges of the board. In FIG. 7a, grounding bus 214c is seen to have an essentially square configuration and to be centrally located on the top surface of board 214; bus 214d may have the same configuration and location on the bottom surface. Board 214, with circuit components and grounding buses mounted thereon, may be housed in any suitable, environmentally sealed casing in a variety of configurations. Rather than employing inner and outer, telescopingly engaged portions, as in the first embodiment, it may be found more convenient to mount the board in a housing having upper and lower portions which mate along longitudinal edges. An example of such a housing is shown in FIGS. 7c–7e wherein upper and lower portions 215 and 217, respectively, enclose circuit board 214 and the components of circuit 212 mounted thereon. Protrusions 221 and 223 are integrally formed with upper and lower portions 215 and 217, respectively, and, when the portions are in assembled relation, extend to firmly engage grounding buses 214c and 214d, respectively. Housing portions 215 and 217 are shown in an essentially flat external configuration to illustrate another of the forms which the housing may take. Separately fabricated cylindrical portions 223 and 225 having external and internal threads, respectively, are affixed in axially aligned relation to opposite sides of the housing. Cylindrical portions 23 and 225 maybe secured in openings cooperatively formed in portions 215 and 217 by pins, screws, or other appropriate fasteners (not shown). Portions 215 and 217 may be mutually secured in the same manner, or by other means. As in the previously described embodiments, assembly 210 provides solid and reliable ground connections for each section of the circuit through grounding buses which are in intimate contact with the housing at ground potential over a substantial area. The points of connection of the four electrical paths between each circuit section on the top of the board and the grounding bus are indicated in FIG. 7b by the letter P. The paths are very short, e.g., on the order of one millimeter.

As previously indicated, the filter assembly of the invention may be employed with any of a wide variety of filter circuits. For illustrative purposes, such a circuit is shown in schematic form in FIG. 8. The components making up the circuit are inductors and capacitors, connected in a diplex configuration. RF signals enter the circuit at input I and pass through inductor L01. By proper selection of component values, signals having a frequency above a first, preselected value pass through the highpass filter (the lower leg of the schematic) consisting of inductors L02–L05 and capacitors C01–C09. Signals having a frequency below a second, preselected value pass through the lowpass filter (the upper leg of the schematic) consisting of inductors L1–L5 and capacitors C1–C7. Signals having frequencies between the first and second values are blocked, with the signals which pass one of the highpass and lowpass filters being combined at output O. Thus, the circuit provides what is termed a bandstop filter, a device employed in a number of applications in the CATV industry. This circuit forms the subject matter of companion application Ser. No. 10/309,376 filed Dec. 3, 2002.

Figure 8:
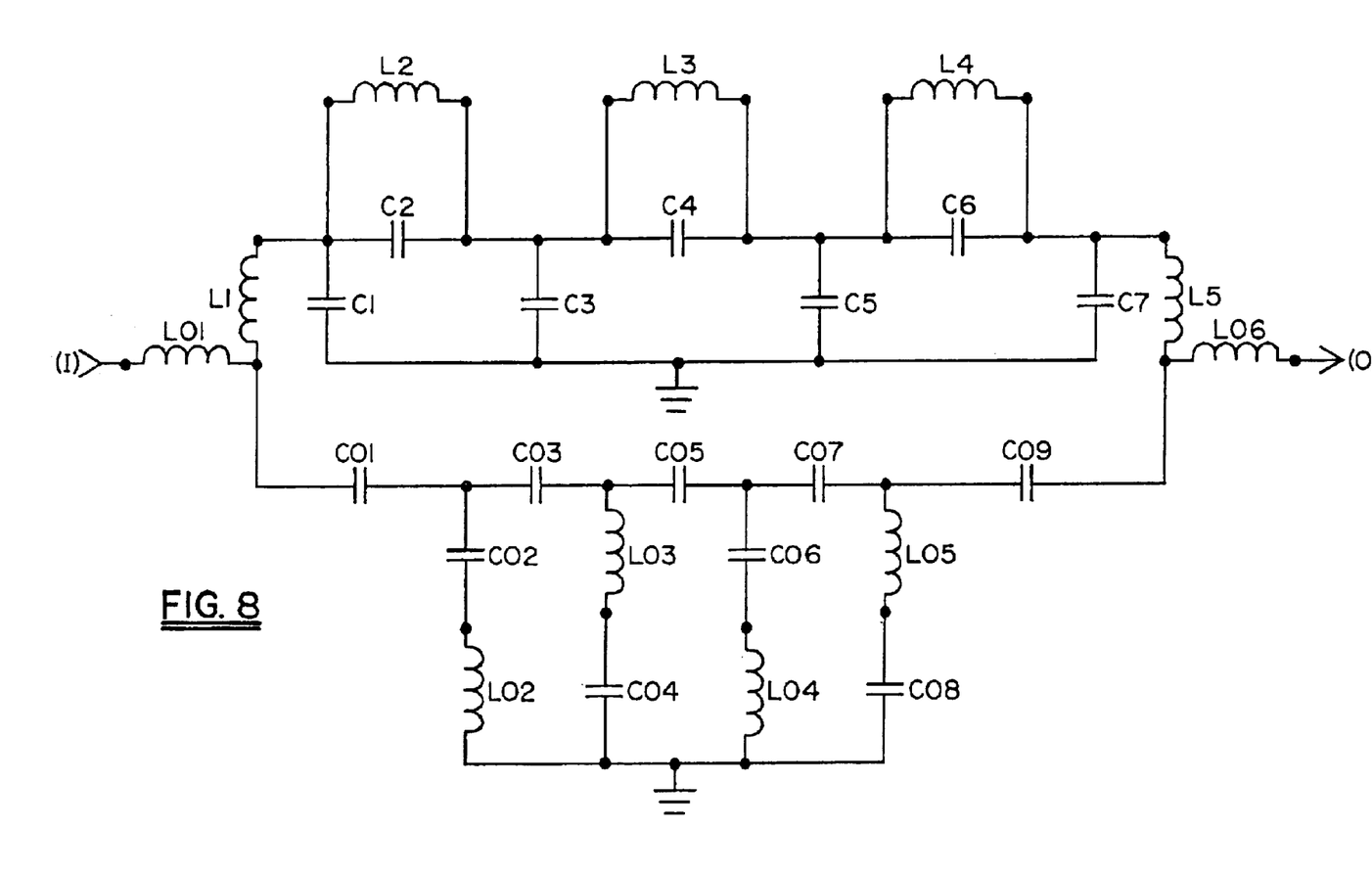
FIG. 8 is a circuit diagram, in schematic form, of an example of a filter circuit which forms the electronic part of the assembly.

The lowpass filter includes three sections, formed by inductor L2 and capacitor C2, by inductor L3 and capacitor C4, and by inductor L4 and capacitor C6, each of which is connected to ground through one or more of capacitors C1, C3, C5 and C7. The highpass filter includes four sections, formed by capacitor C02 and inductor L02, by inductor L03 and capacitor C04, by capacitor C06 and inductor L04, and by inductor L05 and capacitor C08. The sections of the highpass filter are connected directly to ground from components L02, C04, L04 and C08; the sections are connected to the input and output, and to one another, through capacitors C01, C03, C05, C07 and C09.

Figure 9A:
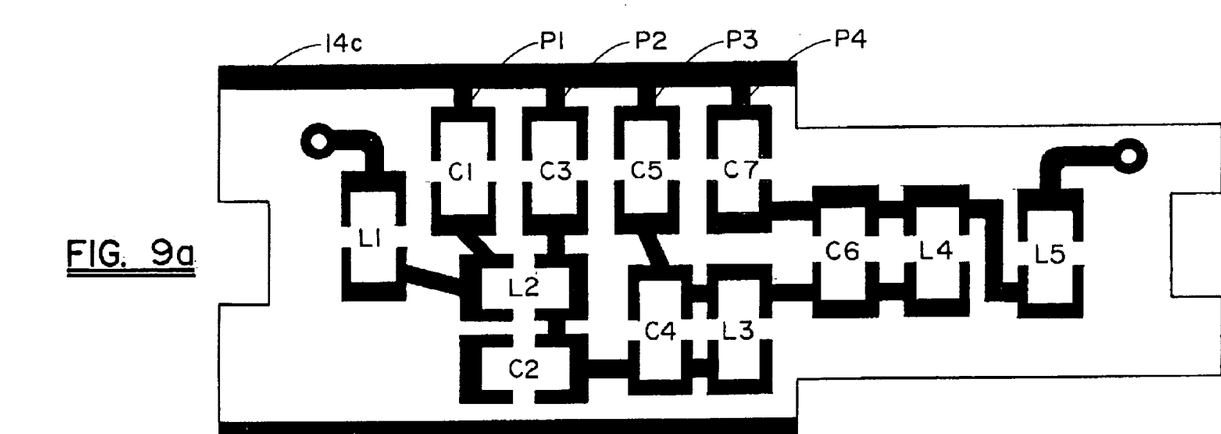
FIGS. 9a and 9b are top and bottom plan views, respectively, showing the physical positioning on opposite surfaces of the circuit board of the components and electrical paths shown schematically in FIG. 8.
Figure 9B:
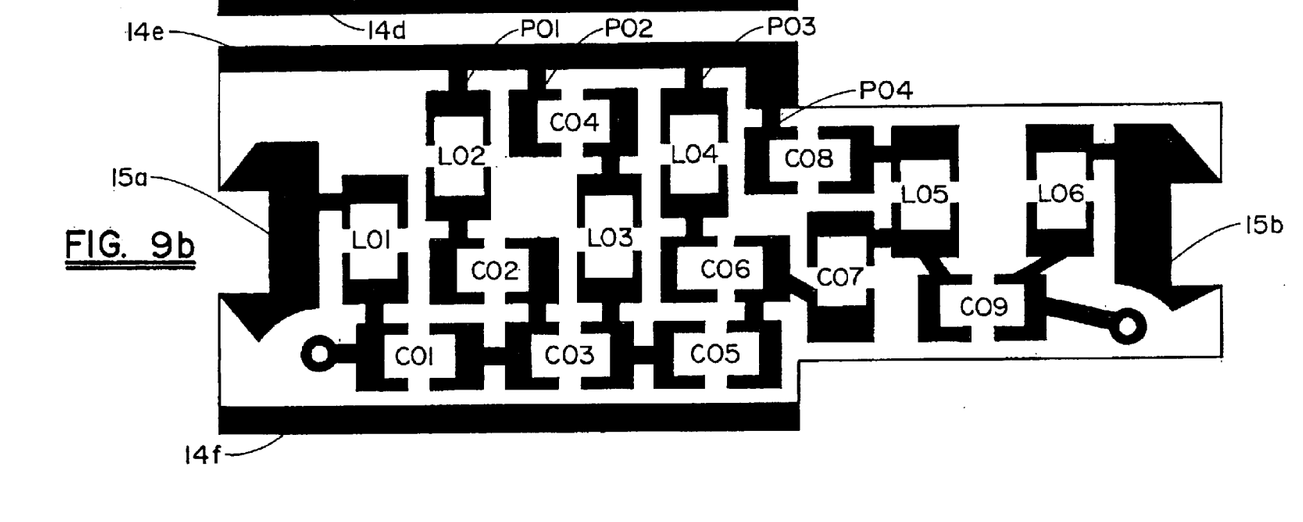

A physical layout of the components of the bandstop filter of FIG. 8 on circuit board 14 is shown in FIGS. 9a and 9b. The top surface of the board, shown in FIG. 9a, carries the components of the lowpass filter, namely, inductors L1–L5 and capacitors C1–C7, together with grounding buses 14c and 14d. The components of the highpass filter (L02–L05 and C01–C09) are mounted on the bottom surface, shown in FIG. 9b, together with grounding buses 14e and 14f, input and output inductors L01 and L06, respectively, and conducting pads 15a and 15b for the male and female connectors, respectively. The electrical paths connecting the sections of the lowpass filter to grounding bus 14c extend from capacitors C1, C3, C5 and C7 and are denoted by reference numerals P1, P2, P3 and P4, respectively. The electrical paths connecting the sections of the highpass filter to grounding bus 14e extend from inductor L02, capacitor C04, inductor L04 and capacitor C08 and are denoted by reference numerals P01, P02, P03 and P04, respectively. It will be noted that each of these paths is very short, the elements being shown in FIGS. 9a and 9b some 7.5 times actual size. It is preferred that none of these paths exceed 2.5 millimeters in length, and in no case are the paths to exceed 5 millimeters in length. Limiting the paths to such lengths effectively precludes degradation of filter performance, particularly at high frequencies, by inductive and capacitive parasitics in the paths. It is also important to note that grounding bus 14c is in firm contact, i.e., electrical communication, with the housing along substantially the full length of the bus, thus precluding any path lengths above the critical length between points where the bus contacts a member at ground potential, i.e., the housing. Although grounding buses 14d and 14f serve no electrical function in the illustrated circuit, their presence is nonetheless preferred to center the board within the slots of the inner housing portion and to be available for use in other circuit layouts.

Figure 10A:
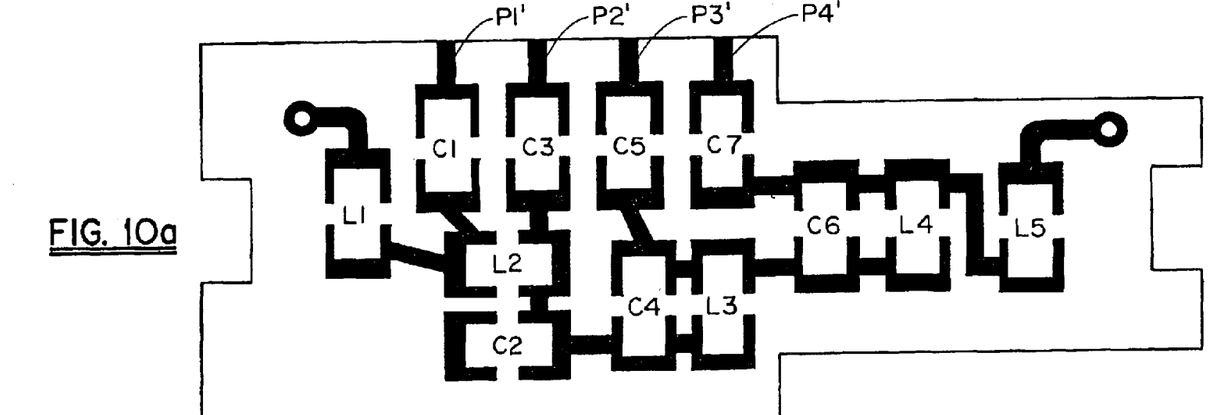
FIGS. 10a and 10b are top and bottom views, respectively, of the surfaces of the circuit board with the components and paths in a version modified from that of FIGS. 9a and 9b.
Figure 10B:
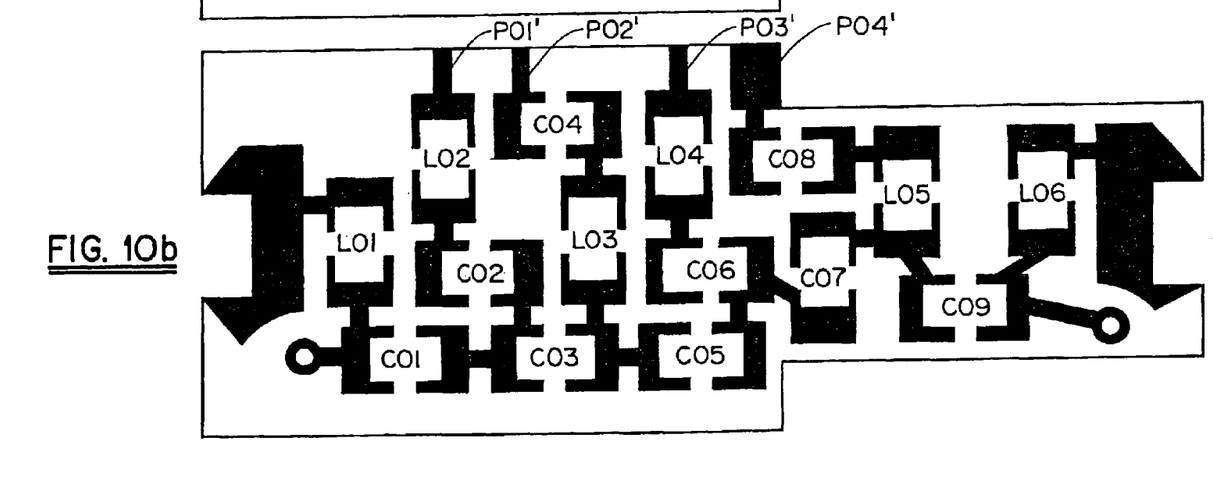

A modified version of the circuit board layout is shown in FIGS. 10a and 10b. The circuit components on each side of the board are the same, and are in the same positions, as in the version of FIGS. 9a and 9b. However, the grounding buses have been removed and the electrical paths which connect each section to ground extend fully to the edge of the board, These paths are indicated in FIG. 10a by reference characters P1', P2', P3' and P4', and in FIG. 10b by characters P01', P02', P03' and P04'. Thus, when such a board is utilized in an assembly with the structural features of FIGS. 1 through 5b, these paths are engaged directly between the opposing edges of the slot and are thereby placed in direct contact with the ultimate grounding member, i.e., the housing. Of course, it is vital to ensure that each of the paths is firmly engaged by an opposing portion of the housing. It is therefore preferred that a "bump," corresponding to bumps 14c–14f of the first embodiment, be provided on each of the paths near the edges of the board.

From the foregoing it will be apparent that the filter assembly of the invention, by recognizing the source of grounding problems which degraded performance in prior art CATV filter circuits, provides an assembly having features by which such problems are greatly reduced or eliminated. Accordingly, the filter circuit incorporated in the assembly of the invention operates in a superior manner, particularly for RF signals in higher frequency ranges (e.g., greater than 300 MHz) with a high quality factor. Although a number of physical embodiments have been shown and described, it is apparent that structural features, as well as assembly techniques are subject to many modifications. For example, rather than narrowing the width of the slots in an inner housing portion by interference fit with an outer portion to move the edges of the slots into engagement with the grounding buses on the circuit board, this function could be performed with an appropriate crimping tool. The critical feature is keeping the electrical path lengths between circuit components and the ground connection, and portions of the grounding buses which are not in direct contact with the housing to a minimum.

What is claimed is:

1. A method of mounting a printed circuit board within a housing, said method comprising:
    a) forming a printed circuit board with elongated, parallel side edges spaced by a predetermined distance, and edge portions inwardly adjacent and extending the full length of said side edges, said edge portions being of a first, electrically conducting material;
    b) mounting a plurality of electrical components upon said circuit board to form a circuit including said edge portions, said components, and electrical paths on said circuit board connecting said components and said edge portions;
    c) forming a housing having opposed wall portions of a second, electrically conducting material spaced by substantially said predetermined distance;
    d) inserting said circuit board into said housing with said side edges contacting said opposed wall portions; and
    e) applying a solder bead mechanically and electrically connecting each of said edge portions, along substantially the full length thereof, with adjoining areas of said opposed wall portions; wherein said edge portions form grounding buses for said circuit.

2. The method of claim 1 wherein said components are surface mount components.

3. The method of claim 1 wherein said circuit board includes top and bottom surfaces and said first, electrically conducting material is present on both sides of both surfaces of said circuit board, making a total of four of said solder beads.

4. The method of claim 1 wherein said housing is a hollow cylinder, having an inside diameter substantially equal to said predetermined distance, said opposed wall portions being diametrically opposite sides of said cylinder.

5. A filter assembly for CATV applications comprising:
    a) a printed circuit board having top and bottom surfaces;
    b) a filter circuit having a plurality of sections each formed by at least two components mounted upon said circuit board in electrically operative connection;
    c) a grounding member of electrically conducting material at ground potential;
    d) a plurality of electrically conductive paths carried on one or both of said top and bottom surfaces, one of said paths extending directly between one of said components of a respective one of said filter circuit sections and said grounding member, and each of said paths having a length of not more than about five millimeters;
    e) wherein said grounding member comprises a grounding bus carried on said circuit board on each of said top and bottom surfaces upon which at least one of said paths is carried; and
    f) at least one housing member wherein at least a portion of said circuit board is mounted, wherein said housing member is at ground potential and said grounding bus is in direct electrical communication with said housing member at all points on said bus spaced by not more than 5 millimeters.

6. The assembly of claim 5 wherein said circuit board has one or more elongated edges and each of said paths extends to one of said edges where it contacts said housing.

7. The assembly of claim 5 wherein said circuit board has at least one elongated edge and said grounding bus extends along a marginal portion of said circuit board inwardly adjacent said at least one edge.

8. The assembly of claim 7 wherein said circuit board has a longitudinal axis and said one edge is a side edge substantially parallel to said longitudinal axis.

9. The assembly of claim 5 wherein said bus is elongated and said electrical communication is provided by a bead of solder mutually connecting said grounding bus and said housing member along substantially the full length of said bus.

10. The assembly of claim 9 wherein said housing is cylindrical and said circuit board has a width substantially equal to the inside diameter of said housing and said grounding bus extends along an outer edge of said board adjacent said housing.

11. The assembly of claim 5 wherein said housing member includes a contact portion and means for urging said contact portion into electrical communication with said grounding bus.

12. The assembly of claim 11 wherein said contact portion comprises an edge of an open slot wherein a portion of said circuit board including at least a portion of said grounding bus is mounted.

13. The assembly of claim 12 wherein said housing member includes an inner section and an outer section and said means for urging comprises an interference fit of said inner within said outer section wherein said edge of said slot is moved into said electrical communication with said grounding bus.

14. The assembly of claim 5 wherein said board has a plurality of bounding edges, said grounding bus is affixed to a portion of said board inwardly of any of said edges, and said housing member includes at least one protrusion extending inwardly of said housing member to contact said grounding bus.

15. The assembly of claim 14 wherein first and second of said grounding buses are affixed to said top and bottom surfaces of said board, respectively, inwardly of any of said edges, and said housing member includes first and second protrusions extending inwardly of said housing from opposite sides thereof to contact said first and second grounding buses, respectively.

16. A filter assembly for CATV applications comprising:
  a) a printed circuit board having top and bottom surfaces, a longitudinal axis and a pair of substantially parallel, elongated, side edges on opposite sides of said axis;
  b) a filter circuit having a plurality of sections formed by components mounted upon said circuit board in electrically operative communication;
  c) a grounding bus of electrically conducting material extending along a marginal portion inwardly adjacent at least one of said side edges on at least one of said top and bottom surfaces;
  d) a hollow, cylindrical, inner housing portion having a first central axis, first inner and outer diameters, and a first, open end with a pair of open slots of predetermined undeformed width extending linearly from said first end, substantially parallel to said central axis, at least one of said slots having a length at least as great as the length of said grounding bus;
  e) said circuit board being mounted at least partially within said inner portion with said edge portions extending into said slots;
  f) a plurality electrically conducting paths, one of said paths extending between a respective one of said plurality of filter circuit sections and said grounding bus; and
  g) a hollow, cylindrical, outer housing portion having a second central axis, second inner and outer diameters, said second inner diameter being smaller than said first outer diameter by a predetermined dimension allowing force fit insertion of said inner portion into said outer portion with resultant narrowing of said predetermined slot width from said undeformed to a deformed width, urging said inner portion into electrically grounding contact with said grounding bus.

17. The filter assembly of claim 16 wherein said edge portions of said circuit board have a thickness less than said undeformed width.

18. The filter assembly of claim 16 wherein said slots are formed on opposite sides of said inner section, with a spacing of substantially 180□ between the centers of said slots.

19. The filter assembly of claim 16 wherein said slots extend from said first open end of said inner portion to terminal ends of said slots for a length substantially equal to the length of said grounding bus.

20. The filter assembly of claim 16 wherein said path is not greater than about 5 millimeters in length.

21. The filter assembly of claim 20 wherein said grounding bus is at least 2 centimeters in length.

22. The filter assembly of claim 16 and further including a raised portion of electrically conducting material in a preselected location on said grounding bus.

23. The filter assembly of claim 22 wherein said grounding bus is of copper and said raised portion is solder.

24. A housing assembly for a printed circuit board having a pair of parallel side edges spaced by a predetermined distance and having a predetermined length and thickness, said assembly comprising:
  a) a first, cylindrical housing member having first and second ends, and first, inner and outer diameters respectively smaller and greater than said predetermined distance;
  b) a pair of slots in opposite sides of said first housing member extending from open ends at said first end of said first housing member to closed ends, said slots having a length at least as great as said predetermined length of said side edges; and
  c) a second, cylindrical housing member having third and fourth ends, and a second, inner diameter over at least a portion of its axial length, said second, inner diameter being smaller than said first, outer diameter by an amount such that forced insertion of said first end of said first housing member into said third end of said second housing member causes said slots to decrease from a first width, greater than said predetermined thickness, to a second width, substantially equal to said predetermined width, whereby edge portions of said circuit board inwardly adjacent said side edges may be placed in said slots prior to said forced insertion and will be physically engaged between opposite sides of said slots after said forced insertion.

25. The housing assembly of claim 24 wherein said circuit board includes electrically conducting portions in said edge portions which are in electrical communication with said first housing member by said physical engaged condition of said edge portions by said opposite sides of said slots.

26. The housing assembly of claim 25 wherein said electrically conducting portions comprise grounding buses extending substantially the full length of said edge portions.

27. The housing assembly of claim 24 and further including first and second seals in said second and fourth ends of said first and second housing members, respectively, and first and second electrical connectors extending from respective connections to said circuit board through said first and second seals, respectively.

28. A method of mounting a printed circuit board within a housing assembly, aid method comprising:
  a) forming a circuit board of predetermined thickness with a pair of parallel side edges spaced by a predetermined distance, and edge portions inwardly adjacent said side edges;
  b) forming an inner housing portion having a hollow, cylindrical wall with a first, open end, a second, sealed end, and first inner and outer diameters;
  c) cutting a pair of parallel, linear slots through said wall at positions where the distance between said inside and outside diameters of said inner housing portion at said slots is smaller and larger, respectively, than said predetermined distance, said slots having a uniform, first width greater than said predetermined thickness and extending from open ends at said first end of said inner portion to closed ends;
  d) forming an outer housing portion having a hollow, cylindrical wall with a third, open end, a fourth, sealed end, and a second inner diameter, smaller than said first, outer diameter by a predetermined dimension;
  e) placing said circuit board with said edge portions in said slots; and
  f) forcibly inserting said first end of said inner portion into said third end of said outer portion, thereby reducing the widths of said slots from said first width to a second width wherein opposing sides of said slots forcibly engage said edge portions of said circuit board inwardly adjacent said side edges.

29. The method of claim 28 and including the further step of placing a deformable O-ring around said inner portion prior to forcibly inserting said first end of said inner portion into said third end of said outer portion at a position such that said O-ring is deformably engaged between said inner and outer portions after said insertion.

30. The method of claim 28 and including the further step of inserting a female connector through one and a male connector through the other of said second and fourth ends, said connectors each being electrically connected to said circuit board.

31. The method of claim 28 wherein said step of forcibly inserting is performed by an arbor press.

32. The method of claim 28 wherein said edge portions of said circuit board include electrically conducting portions forming part of the printed circuit thereon.

33. The method of claim 32 wherein said electrically conducting portions comprise grounding buses extending substantially the full length of said side edges.

34. The method of claim 33 and including the further step of placing at least one raised protrusion of electrically conducting material at a predetermined position on each of said electrically conducting portions.

35. The method of claim 34 wherein said electrically conducting material is solder.

36. The method of claim 34 wherein said predetermined position is substantially closer to said closed end of said slots than to said open end.

37. The method of claim 34 wherein said length of said side edges is substantially equal to the length of said slots.

38. An assembly forming an electrical circuit within a sealed housing with improved grounding means for said circuit, said assembly comprising:

a) a printed circuit board having a plurality of electrical components mounted thereon, with first areas of first, electrically conducting material connecting said components with one another and with at least one second area of electrically conducting material forming a grounding bus for said circuit;

b) a first housing portion of second, electrically conducting material;

c) a second housing portion formed for cooperative, mutual assembly with said first housing portion to provide an enclosed space of a size suitable for containing said circuit board; and d) at least one of said housing portions including an engagement portion which, upon mutual assembly of said first and second housing portions, is in physical and electrical contact with said grounding bus, thereby providing electrical grounding for said circuit;

wherein said first and second housing portions are hollow cylinders which are mutually assembled by forcible, telescopic engagement causing deformation of one of said first and second housing portions into physical and electrical contact of said engagement portion with said grounding bus.

39. The assembly of claim 38 wherein said printed circuit board has elongated, parallel side edges and said grounding bus extends along at least one edge portion inwardly adjacent at least one of said side edges.

40. The assembly of claim 39 wherein said engagement portion comprises at least one edge of a slot extending along and through said first housing portion and wherein said at least one edge portion is positioned.

41. The assembly of claim 38 wherein said circuit board includes top and bottom surfaces and peripheral edges, and said grounding bus is positioned on at least one of said surfaces in spaced relation to said peripheral edges.

42. The assembly of claim 41 wherein said circuit board has a pair of parallel side edges and said grounding bus is positioned substantially centrally between said side edges.

43. The assembly of claim 38 wherein at least one of said grounding buses is positioned on each of said circuit board surfaces and each of said first and second housing portions includes at least one of said engagement portions.

44. The assembly of claim 38 wherein said circuit is a filter circuit for CATV applications.

45. The assembly of claim 44 wherein said circuit board includes top and bottom surfaces and said components are surface mounted upon both of said surfaces.

* * * * *